(12) United States Patent
McCarthy et al.

(10) Patent No.: US 7,977,621 B2
(45) Date of Patent: Jul. 12, 2011

(54) THERMOCHROMIC OPTICAL FILTER IN WHICH TRANSITION WAVELENGTH IS VARIABLE AND CONTROLLABLE BY ADJUSTABLE TEMPERATURE OF A CHOSEN QUANTUM WELL LAYER

(75) Inventors: Wil McCarthy, Lakewood, CO (US); Richard M. Powers, Lakewood, CO (US)

(73) Assignee: RavenBrick LLC, Denver, CO (US)

( * ) Notice: Subject to any disclaimer, the term of this patent is extended or adjusted under 35 U.S.C. 154(b) by 82 days.

(21) Appl. No.: 12/576,847

(22) Filed: Oct. 9, 2009

(65) Prior Publication Data
US 2010/0027099 A1    Feb. 4, 2010

Related U.S. Application Data

(63) Continuation of application No. 11/854,300, filed on Sep. 12, 2007, now Pat. No. 7,601,946.

(60) Provisional application No. 60/825,385, filed on Sep. 12, 2006, provisional application No. 60/825,405, filed on Sep. 12, 2006.

(51) Int. Cl.
*G01J 3/50* (2006.01)

(52) U.S. Cl. ........................................ 250/226; 250/239

(58) Field of Classification Search .................. 250/226, 250/227.21, 227.11, 214.4, 239; 257/13–15; 372/12–16, 27, 43.01, 45.01, 50.21; 359/244–248, 359/260, 298
See application file for complete search history.

(56) References Cited

U.S. PATENT DOCUMENTS

| | | | |
|---|---|---|---|
| 5,013,918 A * | 5/1991 | Choi | ........................ 250/338.4 |
| 5,274,246 A | 12/1993 | Hopkins et al. | |
| 5,347,140 A | 9/1994 | Hirai et al. | |
| 5,530,263 A | 6/1996 | DiVincenzo | |
| 5,585,640 A | 12/1996 | Huston et al. | |
| 5,757,828 A | 5/1998 | Ouchi | |
| 5,763,307 A | 6/1998 | Wang et al. | |
| 5,881,200 A | 3/1999 | Burt | |

(Continued)

FOREIGN PATENT DOCUMENTS

EP    0851506    6/1999

(Continued)

OTHER PUBLICATIONS

Black, C.T., et al., "Integration of self-assembled diblock copolymers for semiconductor capacitor fabrication", Applied Physics Letters, vol. 79, No. 3 (Jul. 16, 2001), pp. 409-411, (American Inst. of Physics, NY).

(Continued)

*Primary Examiner* — Que T Le
(74) *Attorney, Agent, or Firm* — Dorsey & Whitney LLP

(57) ABSTRACT

A thermochromic optical filter incorporating quantum confinement devices is formed as multilayered composite film of semiconducting materials. A quantum well adjacent a barrier layer ensures proper confinement of charge carriers within the well. A transition wavelength (i.e., the energy/wavelength at which the filter becomes transparent) is established by selecting a quantum well material with a bandgap near the desired energy and a barrier layer material with a higher bandgap. For a given reference temperature (e.g., room temperature), the exact transition wavelength is fixed by the thickness of the quantum well. The quantum confinement energy is added to the bandgap energy to yield the transition energy. A thermal control system varies the temperature of the thermochromic filter to adjust the transition wavelength. Temperature changes affect both the bandgap and the quantum confinement energy, and thus the optical properties of the thermochromic filter. The thermochromic filter may function as a longpass filter.

20 Claims, 3 Drawing Sheets

U.S. PATENT DOCUMENTS

| | | |
|---|---|---|
| 5,889,288 A | 3/1999 | Futatsugi |
| 5,937,295 A | 8/1999 | Chen et al. |
| 6,040,859 A | 3/2000 | Takahashi |
| 6,240,114 B1 | 5/2001 | Anselm et al. |
| 6,281,519 B1 | 8/2001 | Sugiyama et al. |
| 6,294,794 B1 | 9/2001 | Yoshimura et al. |
| 6,304,784 B1 | 10/2001 | Allee et al. |
| 6,320,220 B1 | 11/2001 | Watanabe et al. |
| 6,329,668 B1 | 12/2001 | Razeghi |
| 6,333,516 B1 | 12/2001 | Katoh et al. |
| 6,437,361 B1 | 8/2002 | Matsuda |
| 6,498,354 B1 | 12/2002 | Jefferson et al. |
| 6,512,242 B1 | 1/2003 | Fan et al. |
| 6,600,169 B2 | 7/2003 | Stintz et al. |
| 6,611,640 B2 | 8/2003 | LoCasclo et al. |
| 6,635,898 B2 | 10/2003 | Williams et al. |
| 6,661,022 B2 | 12/2003 | Morie et al. |
| 6,753,273 B2 | 6/2004 | Holonyak, Jr. et al. |
| 6,770,916 B2 | 8/2004 | Ohshima |
| 6,777,718 B2 | 8/2004 | Takagi |
| 6,816,525 B2 | 11/2004 | Stintz et al. |
| 6,946,697 B2 | 9/2005 | Pietambaram et al. |
| 6,978,070 B1 | 12/2005 | McCarthy et al. |
| 7,026,641 B2 | 4/2006 | Mohseni et al. |
| 7,276,432 B2 | 10/2007 | Snyder et al. |
| 7,470,925 B2 | 12/2008 | Tamura et al. |
| 2002/0080842 A1 | 6/2002 | An et al. |
| 2002/0152191 A1 | 10/2002 | Hollenberg et al. |
| 2003/0066998 A1 | 4/2003 | Lee |
| 2003/0107927 A1 | 6/2003 | Yerushami et al. |
| 2005/0157996 A1 | 7/2005 | McCarthy et al. |
| 2006/0011904 A1 | 1/2006 | Snyder et al. |
| 2006/0049394 A1 | 3/2006 | Snyder et al. |
| 2006/0151775 A1 | 7/2006 | Hollenberg et al. |

FOREIGN PATENT DOCUMENTS

| | | |
|---|---|---|
| GB | 2261989 | 11/1991 |
| JP | 2003-248204 | 9/2003 |
| KR | 10-2002-0013986 | 2/2002 |
| WO | WO/98/53504 | 11/1998 |
| WO | WO 2008/106596 | 9/2008 |

OTHER PUBLICATIONS

Goldhaber-Gordon, D., et al., "Overview of Nanoelectronic Devices", Proceedings of the IEEE, 85(4):521-533, Apr. 1997.

Kastner, Marc A., "Artificial Atoms", Physics Today, Jan. 1993.

Kouwenhoven, Leo et al., "Quantum Dots", Physics World, Jun. 1988, pp. 35-39.

Leatherdale, C.A., et al., "Photoconductivity in CdSe Quantum Dot Solids", Phys. Review B, 62(4):2669-2680, Jul. 15, 2000.

Mccarthy, Wil, "Once Upon a Matter Crushed", Science Fiction Age, Jul. 1999.

Mccarthy, Wil, "The Collapsium", Del Rey Books, Aug. 2000 and Orion Books, Oct. 2000.

Mccarthy, Wil, "Programmable Matter", Nature, 407:127, Oct. 5, 2000.

Orlov, Alexei O., et al., Clocked Quantum-Dot Cellular Automata Devices: Experimental Studies, IEEE-NANO 2001, Oct. 30, 2001, pp. 425-430.

Ryu, Du Yeol et al., "A generalized approach to the modification of solid surfaces", Science, vol. 308 (Apr. 8, 2005), pp. 236-239.

Soh, Hyongsok T., et al., "Scanning proble lithography", ch. 3, pp. 40-66 (2001) (Kluwer Academic Publishers, Norwell MA).

Turton, Richard, "The Quantum Dot", Oxford University Press, 1995.

Xu, Ting et al., "The influence of molecular weight on nanoporous polymer films", Polymer, 42 (Apr. 2001), pp. 9091-9095 (Elsevier Science Ltd.).

* cited by examiner

THERMOCHROMIC OPTICAL FILTER IN WHICH TRANSITION WAVELENGTH IS VARIABLE AND CONTROLLABLE BY ADJUSTABLE TEMPERATURE OF A CHOSEN QUANTUM WELL LAYER

CROSS REFERENCE TO RELATED APPLICATIONS

This application is a continuation of U.S. patent application Ser. No. 11/854,300 filed 12 Sep. 2007 entitled "Electromagnetic sensor incorporating quantum confinement structures," which claims priority pursuant to 35 U.S.C. 119(e) to U.S. provisional application Nos. 60/825,385 and 60/825,405, both filed 12 Sep. 2006, each of which is hereby incorporated herein by reference in its entirety.

BACKGROUND

The fabrication of very small structures to exploit the quantum mechanical behavior of charge carriers e.g., electrons or electron "holes" is well established. Quantum confinement of a charge carrier can be accomplished by a structure having dimensions less than the quantum mechanical wavelength of the carrier. Confinement in a single dimension produces a quantum well, and confinement in two dimensions produces a quantum wire, while a quantum dot is a structure capable of charge confining carriers in all three dimensions.

Quantum confinement effects may be observed in films or other structures with dimensions less than the charge carrier de Broglie wavelength, the electron-hole Bohr diameter, the charge carrier inelastic mean free path, and the ionization diameter, i.e., the diameter at which the charge carrier's quantum confinement energy is equal to its thermal-kinetic energy. It is postulated that the strongest confinement may be observed when all of these criteria are met simultaneously. Such structures may be composed of semiconductor materials (for example, Si, GaAs, AlGaAs, InGaAs, InAlAs, InAs, and other materials), or of metals, and may or may not possess a solid insulative barrier or coating.

Typically, a quantum well consists of a conducting or semiconducting film, anywhere from a few nanometers to a few tens of nanometers thick, surrounded by barrier materials. At cryogenic temperatures, quantum confinement can be achieved using a thicker well structure.

Quantum dots can be formed as crystalline or lattice structures as particles and are referred to in this document as "quantum dot particles." A quantum dot can also be formed inside a semiconductor substrate through electrostatic confinement of the charge carriers. This is accomplished through the use of microelectronic devices of various design, e.g., an enclosed or nearly enclosed gate electrode formed on top of a quantum well. Here, the term "micro" means "very small" and usually expresses a dimension of or less than the order of microns (thousandths of a millimeter). The term "quantum dot device" refers to any apparatus capable of generating a quantum dot in this manner. The generic term "quantum dot," abbreviated "QD" in certain of the drawings herein, refers to the confinement region of any quantum dot particle or quantum dot device.

The electrical, optical, thermal, magnetic, mechanical, and chemical properties of a material depend on the structure and excitation level of the electron clouds surrounding its atoms and molecules. Doping is the process of embedding precise quantities of carefully selected impurities in a material in order to alter the electronic structure of the surrounding atoms, for example, by donating or borrowing electrons from them and therefore altering the material's electrical, optical, thermal, magnetic, mechanical, or chemical properties. Impurity levels as low as one dopant atom per billion atoms of substrate can produce measurable deviations from the expected behavior of a pure crystal and deliberate doping to levels as low as one dopant atom per million atoms of substrate are commonplace in the semiconductor industry, for example, to alter the conductivity of a semiconductor.

Quantum dots can have a greatly modified electronic structure from the corresponding bulk material, and therefore different properties. Quantum dots can also serve as dopants inside other materials. Because of their unique properties, quantum dots are used in a variety of electronic, optical, and electro-optical devices. Quantum dots are currently used as near-monochromatic fluorescent light sources, laser light sources, light detectors including infra-red detectors, and highly miniaturized transistors, including single-electron transistors. Quantum dots can also serve as a useful laboratory for exploring the quantum mechanical behavior of confined carriers. Many researchers are exploring the use of quantum dots in artificial materials and as dopants to affect the optical and electrical properties of semiconductor materials.

The optical response of a semiconductor is a function of its bandgap—a material-specific quantity. For photons with energies below the bandgap, the semiconductor is generally transparent, although material-specific absorption bands may also exist. Photons with energies higher than the bandgap are capable of creating electron-hole pairs within the semiconductor, and thus are generally absorbed or reflected. Thus, a material like gallium arsenide (bandgap 1.424 eV) is transparent to infrared photons with a wavelength of 871 nanometers or greater, and opaque to visible light, whereas $SiO_2$ (bandgap~9.0 eV) is transparent to visible and near-ultraviolet light with a wavelength greater than 138 nm. Thus, semiconductor materials are capable of serving as optical, infrared, or ultraviolet longpass filters.

IR/optical filters and switches currently exist. Light can be blocked by filters which absorb or reflect certain frequencies while allowing others to pass through. Shortpass and longpass filters may be used, or a narrow range of frequencies can be blocked by a notch filter or bandblock filter, or transmitted by a bandpass filter.

The addition of a mechanical shutter can turn an otherwise transparent material—including a filter—into an optical switch. When the shutter is open, light passes through easily. When the shutter is closed, no light passes. If the mechanical shutter is replaced with an electrodarkening material such as a liquid crystal, then the switch is "nearly solid state", with no moving parts except photons, electrons, and the liquid crystal molecules themselves. This principle is used, for example, in LCD displays, where the white light from a backdrop is passed through colored filters and then selectively passed through or blocked by liquid crystal materials controlled by a transistor. The result is a two-dimensional array of colored lights which form the pixels of a television or computer display.

Thermochromic materials also exist, which change their color (i.e., their absorption and reflection spectrum) in response to temperature. Liquid crystal thermometers are based on this principle and thermochromic plastics are sometimes incorporated into baby bathtubs as a visual indicator of water that may be too hot or too cold for safety or comfort. Thermochromic paints are sometimes used to help regulate the temperature of objects or buildings under heavy sunlight.

Tunable filters also exist, which rely on various mechanical principles such as the piezoelectric squashing of a crystal or the rotation or deformation of a lens, prism, or mirror, in order to affect the filter's optical properties. Most notable of these is the Fabry-Perot interferometer, also known as an etalon. Like any mechanical device, such tunable filters are much more vulnerable to shock, vibration, and other related failure modes than any comparable solid-state device.

Imaging sensors that incorporate etalon-based tunable filters are sometimes used in remote sensing applications, e.g., on spacecraft or telescopes. Two fundamental drawbacks of such filtering systems are: 1) that target object must be placed precisely in a very small part of the field, thus the filtered observations are only a small portion of the available field of view; and 2) the added mass, volume, and reliability costs associated with mechanically controlling the etalon.

The information included in this Background section of the specification, including any references cited herein and any description or discussion thereof, is included for technical reference purposes only and is not to be regarded as subject matter by which the scope of the invention is to be bound.

SUMMARY

A tunable filter uses a combination of quantum confinement and temperature control to alter the transition wavelength at which the filter becomes transparent. The term "thermochromic optical filter incorporating quantum confinement devices" (hereinafter a "thermochromic filter") refers to a solid-state device or component with an input path, an output path, and a semiconductor filter material, which uses temperature to regulate the effective bandgap and which additionally uses the quantum confinement of charge carriers to set the transition wavelength or wavelengths at which the material ceases to reflect or absorb light and instead transmits it.

One exemplary implementation of a thermochromic filter device may be a composite film formed as a sandwich of heterogeneous materials composed of or incorporating quantum confinement devices that alter the optical properties of the sandwich and thus affect the flow of light through the composite film. The thermochromic filter film may include multiple quantum confinement layers and may be attached to a transparent substrate for structural or other reasons. When the temperature of the thermochromic filter film is altered (for example, by the use of solid-state heaters and thermoelectric coolers, one or more temperature sensors, and a thermostat circuit), the transition energy changes and thus alters the optical response of the thermochromic filter.

Although the structure and composition of a thermochromic filter device, and the quantum confinement structures embedded within it, may produce peaks or bands of absorption or transmission in certain regions of the spectrum, the thermochromic filter device described herein may act predominantly as a longpass filter. As a longpass filter, the room-temperature edge or transition wavelength of the thermochromic filter device may be determined by the dimensions and composition of the quantum confinement structures (e.g., a quantum well of known thickness). Further, the operational transition wavelength of the thermochromic filter device may be set dynamically through control of the temperature of the thermochromic filter device. The thermochromic filter has particular but not exclusive application as an optical (i.e., visible light, ultraviolet, and infrared) filter for photography, spectroscopy, remote sensing, and optical networking.

In some embodiments, the thermochromic filter device may include multiple well and barrier layers, as in a superlattice. In other embodiments, the quantum well layer may be replaced with a layer containing an arrangement of quantum wires, which maybe parallel, stacked, woven, braided, or randomly deposited. In still other embodiments, the quantum well layer may be replaced with a layer containing an arrangement of quantum dots, either particles or devices. In each of these cases, the properties of these quantum confinement devices are used to modify the bulk properties of the material and thus establish the optical response of the thermochromic filter device at room temperature, or at some other specified reference temperature.

Some implementations may include only a multi-layered thermochromic filter, while control of the temperature—and thus the optical properties—of the thermochromic filter device are accomplished by external means. Other embodiments may include a system for controlling the temperature of the thermochromic filter device. In these embodiments, control may be accomplished by a combination of cooling devices, heating devices, temperature sensors, and thermostats or thermal control circuits. In some embodiments, all of the temperature control devices may be solid-state, with no moving parts, although mechanical heaters, coolers, and thermostats could be employed with equal efficacy. It should be understood that in some circumstances, it may be possible to control the temperature with only some of these components. For example, cooling devices may be unnecessary in cold environments, while heating devices may be unnecessary in hot environments. It may also be possible to dispense with temperature sensors and thermostats and regulate the optical properties of the thermochromic filter device simply by varying the heat output or duty cycle of the heating device or devices. Many other arrangements are possible, and these examples should not be construed as limiting in scope.

In one implementation, the thermochromic filter device may be in the form of a tunable optical filter that can regulate the flow of light based on the temperature of the thermochromic filter material.

In another implementation, the thermochromic filter device may be a solid-state tunable filter. Unlike tunable filters which rely on piezoelectrics or mechanical rotation or deformation, the thermochromic filter device may be designed to contain no moving parts other than photons and electrons.

In an additional implementation, the thermochromic filter device may also be programmable with light-regulating properties that are externally controllable through the application of electrical energy to the heaters and coolers or through command signals to a temperature controller circuit.

In a further implementation, the thermochromic filter device may be in the form of a switch capable of generating light (e.g., by fluorescing in response to short-wavelength light), or generating electricity from incident light (e.g., via the photoelectric effect), as a side effect of its normal operation.

In yet another implementation, the thermochromic filter device may be formed by multiple layers of quantum dot devices stacked into three-dimensional structures whose properties can be adjusted through external signals. The thermochromic filter device may thus form a programmable smart material whose bulk optical properties can be varied on demand.

In yet a further implementation, the thermochromic filter device may be capable of achieving specific transition energies that do not correspond with the bandgap of any known material, and thus may be difficult to achieve through any other means.

Other features, details, utilities, and advantages of the present invention will be apparent from the following more particular written description of various embodiments of the invention as further illustrated in the accompanying drawings and defined in the appended claims.

DETAILED DESCRIPTION

Figure 1:
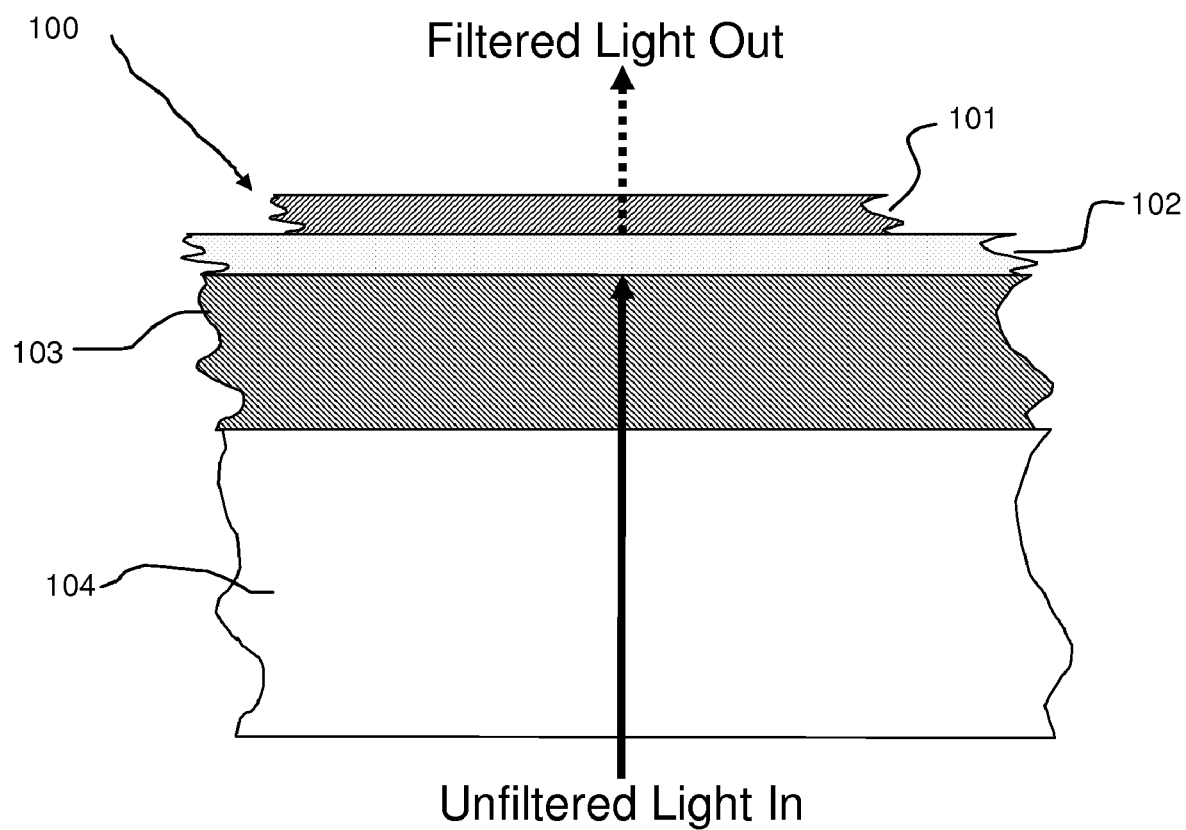
FIG. 1 is a schematic, cross-section view of an implementation of a thermochromic filter device depicting a quantum well layer surrounded by upper and lower barrier layers, attached to a transparent substrate. Unfiltered light enters through the bottom of the device and is modified by the thermochromic filter, so that filtered light exits through the upper surface of the thermochromic filter device.

Quantum confinement structures may be arranged within a layered composite film to produce an optical filter device whose transition wavelength—the wavelength above which it transmits light—is fixed at a particular, desired value at a particular reference temperature (e.g., room temperature) and is then adjustable through changes in the temperature of the optical filter. This thermochromic filter device may have one or more quantum confinement layers (typically a quantum well, but alternatively layers of quantum dots or quantum wires) of precise dimension and composition surrounded by barrier layers. Optionally, the optical filter may also include a transparent substrate for mechanical stability or other purposes. The thermochromic filter device may also include heaters, coolers, temperature sensors, and thermostats or thermal control circuitry, although the temperature of the optical filter may alternatively or additionally be controlled by external means.

For the purposes of this document, the term "optical" refers to visible, ultraviolet, and infrared light which obey the normal rules of optics. By this definition, long-wavelength infrared, microwaves, radio waves, extreme ultraviolet, x-ray, and gamma radiation are not optical radiation.

The optical response of a semiconductor is a function of its bandgap—a material-specific quantity. For photons with energies below the bandgap, the semiconductor is generally transparent, although material-specific absorption bands may also exist. Photons with energies higher than the bandgap are capable of creating electron-hole pairs within the semiconductor, and thus are generally absorbed or reflected. Thus, a material like gallium arsenide (bandgap 1.424 eV) is transparent to infrared photons with a wavelength of 871 nanometers or greater, and opaque to visible light, whereas $SiO_2$ (bandgap~9.0 eV) is transparent to visible and near-ultraviolet light with a wavelength greater than 138 nm. Thus, semiconductor materials are capable of serving as optical, infrared, or ultraviolet long-pass filters.

A semiconductor will also generally show a strong emission or luminescence peak at this transition energy, i.e., when stimulated with an electrical current or with absorbed photons of higher energy, the material will emit photons at the transition energy as a result of electron-hole recombinations within the material. Photoluminescence (i.e., stimulating the material with high-frequency light and measuring the resulting fluorescence or emission spectrum) is therefore useful as a diagnostic tool, to determine the quantum confinement energy of a quantum well and thus predict its optical properties. Strong absorption at and above the transition energy is also capable of generating photoelectric effects within the semiconductor as large numbers of electron-hole pairs are created.

However, the energy of an electron confined in a quantum well is not only a function of bandgap, but of the quantum confinement energy, which depends on the thickness of the well and the energy height of the surrounding barriers (i.e., the difference in conduction band energy between the well and barrier materials). This "bandgap plus quantum confinement" energy moves the transparency of the material into shorter wavelengths. Thus, while a bulk GaAs sample emits and absorbs photons at approximately 870 nm, a 10 nm GaAs quantum well surrounded by $Al_{0.4}Ga_{0.6}As$ barriers has a 34 meV quantum confinement energy and thus shows the same transition at approximately 850 nm. Therefore, for a given set of materials and a given reference temperature, the transition energy can be fixed precisely through the fabrication of a quantum well of known thickness. It should be noted, however, that the bandgap is a temperature-dependent quantity. As the temperature of a semiconductor decreases, its bandgap increases slightly. When the semiconductor is heated, the bandgap decreases.

At the time of manufacture, the material for the quantum well layer may be selected to have a bandgap near the photon energy of the desired transition wavelength. The barrier layers may then be selected to have a higher conduction band energy than the well material, which in general means a larger bandgap. This ensures the quantum well is surrounded by finite (i.e., nonzero) energy barriers capable of confining charge carriers in the desired energy range, and also ensures that the energy barriers are generally transparent to photons at or near the transition wavelength (although material-dependent absorption peaks or bands may exist even at lower energies and/or longer wavelengths).

The thickness of the quantum well layer of the thermochromic filter may then be selected such that the quantum confinement energy of the confined carriers, added to the bandgap energy of the well material, yields a transition frequency at exactly the desired value for the reference temperature. Depending on the materials and desired energies/wavelengths, this thickness may be anywhere from less than a nanometer to several tens of nanometers, or even several microns for devices intended to operate at cryogenic temperatures. In the more typical case, for room-temperature thermochromic filter devices made of common semiconductor materials and operating in the visible, near-infrared, and near-ultraviolet wavelengths, thicknesses between 2 nm and 20 nm may be the most common.

The thermochromic filter may be operated by adjusting its temperature. At higher temperatures, the bandgap and the transition energy (i.e., the bandgap+quantum confinement energy) both decrease, resulting in a larger transition wavelength. In other words, the thermochromic filter becomes opaque to certain frequencies where it had previously been transparent. When the temperature of the thermochromic filter is reduced, the opposite happens: the bandgap and transition energy increase, the transition wavelength becomes smaller, and the filter becomes transparent at wavelengths where it had previously been opaque.

FIG. 1 is a schematic, cross-section view of a simple embodiment of a thermochromic filter device 100 depicting a quantum well layer 102 surrounded by upper and lower barrier layers 101 and 103, attached to an optional transparent substrate 104. It may be desirable to place transparent substrates on both sides of the thermochromic filter device 100 in order to stabilize and protect it. Alternatively, since the barrier layers 101, 103 must be transparent to light in the operating range of the thermochromic filter device 100, they may also serve as substrates on one or both sides of the quantum well material 102. In other words, the barrier layer 103 and the substrate 104 may in fact be a single layer composed of a single material. In fact, the upper barrier layer 101 is also optional, since confined carriers are not generally capable of escaping the quantum well layer 102 into free space (i.e., free space, whether air, vacuum, or some other medium, generally presents a gigantic barrier in its own right). However, the quantum well layer 102 may typically be only a few nanometers thick and can therefore be damaged by even casual contact with other materials. Therefore, the addition of the barrier layer 101 and/or a transparent substrate layer 104 maybe advantageous for most applications where tunable filters are used.

It should be realized that the quantum well layer 102 may be formed as a layer of quantum wires or quantum dots in order to increase the quantum confinement energy of the quantum well layer 102 without increasing the thickness, or for other reasons relating to the specific application for which the thermochromic filter device 100 may be used. In either case, unfiltered light enters through the bottom of the thermochromic filter device 100 and is modified by the thermochromic filter, so that filtered light exits through the upper surface of the thermochromic filter device 100.

Figure 2:
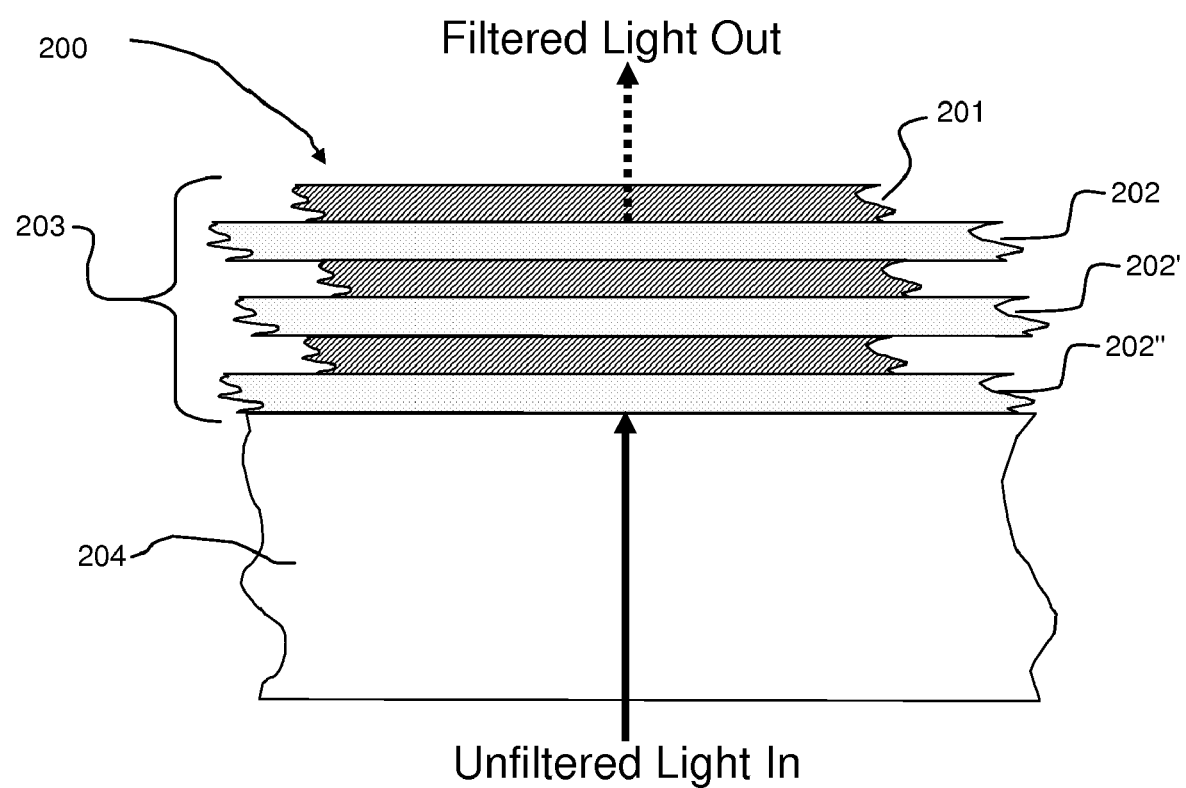
FIG. 2 is a schematic, cross-section view of an alternate implementation of a thermochromic filter device incorporating multiple quantum wells and barrier layers.

FIG. 2 is a schematic representation of an alternative embodiment of a thermochromic filter device 200 incorporating multiple quantum well layers 202, 202', 202" and barrier layers 201, 201', 201" supported on an optional substrate 204. This increases the total thickness of the active region of the thermochromic filter 203 without altering the thickness (and thus the quantum confinement energy) of any given quantum well layer 202, 202', 202". As in FIG. 1, unfiltered light enters through the bottom of the thermochromic filter device 200, passes through the substrate layer 204, and interacts with the barrier layers 201, 201', 201" and the quantum well layers 202, 202', 202", so that filtered light, with wavelengths excluded below the transition wavelength, exits from the upper surface of the thermochromic filter device 200.

It should be realized that it may be desirable for these multiple well layers 202, 202', 202" to have different thicknesses, or possibly even different compositions from one another, in order to set certain parameters of the thermochromic filter 203, such as the slope of its transmission spectrum near the transition wavelength. Thus, the filtering properties of the thermochromic filter device 200 are enhanced, reducing its transmissivity to unwanted wavelengths, with no effect on its nominal transition energy or transition wavelength. It may also be desirable for some or all of the quantum well layers 202, 202', 202" to be replaced with layers of quantum dots or quantum wires, not necessarily identical to one another in dimension or composition. However, use of quantum dots or quantum wires does not fundamentally change the thermochromic filtering properties of the thermochromic filter device 200.

Figure 3:
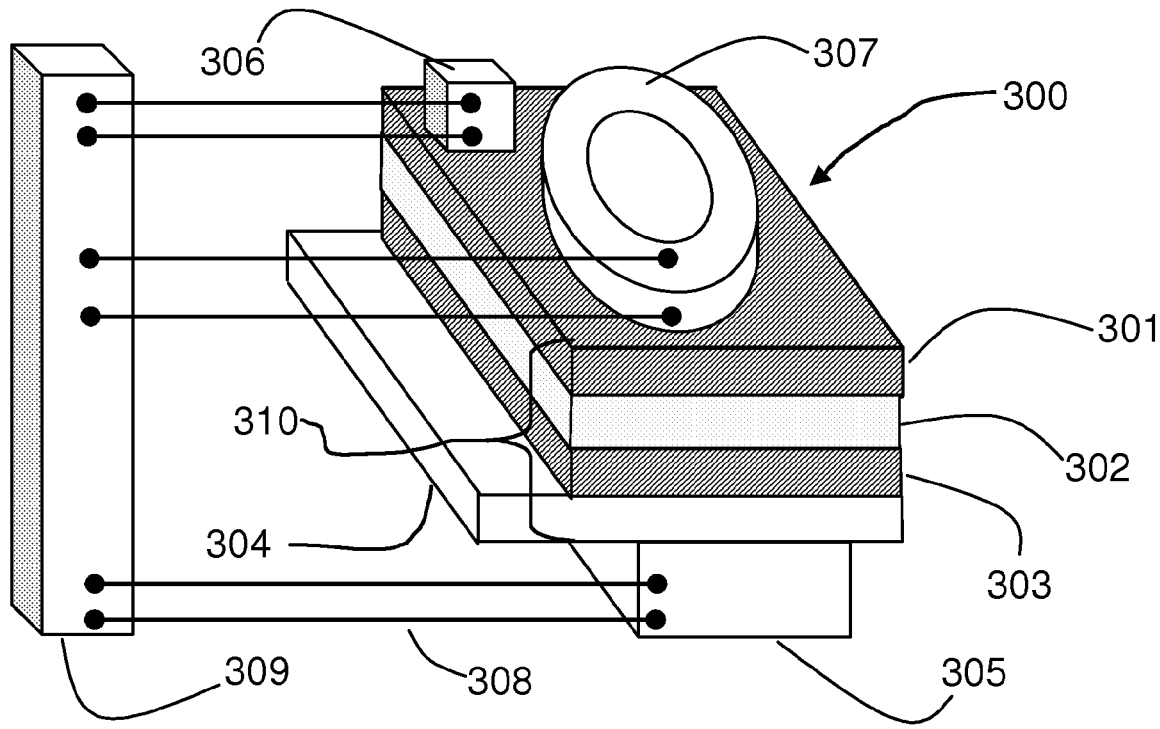
FIG. 3 is a schematic representation of further implementation of a thermochromic filter device, which includes an apparatus for controlling the temperature of the thermochromic filter.

FIG. 3 is a schematic representation of an implementation that includes an apparatus for controlling the temperature of a thermochromic filter 310, in a thermochromic filter device 300. As before, the thermochromic filter device 300 includes barrier layers 301 and 303 surrounding a well layer 302, with a transparent substrate layer 304 providing structural support. In addition, a temperature control system may be attached to the thermochromic filter 310. Components of the temperature control system may include a heating device 305, a temperature sensor 306, and a cooling device 307. In one embodiment these devices may be annular in shape and/or may be located around the periphery of the thermochromic filter, so as not to block the light passing through the center of the thermochromic filter 310. In addition, although mechanical heat pumps and thermometers may be used, the heater 305, cooler 307, and temperature sensor 306 may all be solid-state devices with no moving parts, other than electrons. For example, with a thermocouple acting as the temperature sensor 306, a resistive heating element (e.g., a power resistor) acting as the heater 305, and a thermoelectric cooler ((TEC), e.g., a Peltier junction, a Peltier-Seebeck junction, or a Thompson effect device) acting as a cooling device 307, the thermochromic filter may be adjustable over a broad range of temperatures.

The heating device 305, cooling device 307, and temperature-sensing device 306 may be connected by wires 308 to a temperature-regulating device 309, which reads the temperature of the thermochromic filter 310 and adjusts the output of the heating device 305 or cooling device 307 appropriately in order to keep the thermochromic filter 310 at a particular desired temperature, and thus a particular transition wavelength. In one embodiment, the regulating device is a solid-state thermostat or thermal control circuit.

It should be understood that the thermochromic filter devices disclosed herein may include any necessary or convenient supporting hardware, such as solder, adhesives, or mechanical attachments to hold the hardware in place on the thermochromic filter, thermal gaskets, seals, or other connectors to improve heat flow between the heating and cooling devices and the thermochromic filter materials, and/or a heat sink attached to the thermoelectric cooler to maximize its ability to transport heat away from the thermochromic filter device. It should also be understood that for some applications, adequate thermal control may be achieved with some of these components absent, non-operational, or external to the thermochromic filter device. Thus, the configuration shown in FIG. 3 is for exemplary purposes only, and should not be construed as limiting in scope.

From the description above, the thermochromic filter can be understood to provide a number of new capabilities. Specifically, the thermochromic filter provides a tunable optical filter that can regulate the flow of light based on the temperature of the filter material, within a range specified by the composition and internal structure of the thermochromic filter, in a completely solid-state package. Unlike tunable filters which rely on piezoelectric actuators for mechanical rotation or deformation, the thermochromic filter contains no moving parts other than photons and electrons and is therefore more compact and more robust than prior known tunable filters. The thermochromic filter may also be fully programmable, i.e., the light-regulating properties may be controlled externally through the application of electrical energy to the heaters and coolers or through command signals to the temperature controller circuit. The thermochromic filter device may also be capable of achieving specific transition energies that do not correspond with the bandgap of any known material, and thus may be difficult to achieve through any other means.

In addition, as a side effect of its composition and structure, the thermochromic filter device may also be capable of generating light (for example, when fluorescing in response to short-wavelength light), or generating electricity from incident light (e.g., via the photoelectric effect), in addition to its normal function as a tunable optical filter. In fact, multiple layers of quantum confinement structures and/or devices may be stacked into three-dimensional structures whose properties can be adjusted through external signals. The thermochromic filter device may thus form a type of programmable smart material whose bulk optical and electro-optical properties can be varied on demand.

Although the description above contains many specificities, these should not be construed as limiting the scope of the invention, but rather construed as merely providing illustrations of certain exemplary embodiments of this invention. There are various possibilities for making a thermochromic filter of different materials, and in different configurations. It should also be noted that while the GaAs family of materials is used in exemplary form within this document, a huge variety of different materials could be used instead, including insulators, semiconductors, conductors, or superconductors. There are particular advantages to using higher-bandgap materials, as they not only allow for energetically "deeper" quantum wells, but in many cases also allow the well and barriers to be transparent to light of higher energies and shorter wavelengths.

In the interests of concision, the term "optical" has been used throughout this document, even though it excludes long-wavelength infrared, microwaves, radio waves, extreme ultraviolet, x-ray, and gamma radiation. However, it will be apparent to a person skilled in the art that if the quantum well and barrier materials and dimensions are selected such that the resulting structure has a transition wavelength in one of these bands, the thermochromic filter will still function as described above, even though the radiation is not "optical" per se.

It should also be noted that some materials (e.g., mercury, vanadium dioxide) behave as conductors at higher temperatures and as semiconductors at lower temperatures. Since conductors generally reflect light rather than absorb it, a quantum well layer composed of such a material would, above the conductivity threshold temperature of the material, suddenly become reflective. This is a thermochromic optical property and, where coupled with quantum confinement nanostructures, is explicitly considered an embodiment of a thermochromic filter.

Numerous other variations exist which do not affect the operation of the thermochromic filter. For example, the shape of a thermochromic filter device need not be planar as shown in the figures, but may be in the form of flexible sheets, ribbons, fibers, or cylinders, or formed into or around solid shapes including, but not limited to, the following: cylinders, spheres, cones, prisms, and polyhedrons, both regular and irregular, asymmetric forms, and other two-dimensional and three-dimensional structures. The quantum well layers may be replaced with layers of quantum dots or quantum wires. The thermochromic filter device may also be employed in flexible forms such as sheets, fibers, and ribbons, with quantum dot devices on one or both surfaces. It is also conceivable to grow the thermochromic filter on the inside surface of a complex, porous, or "spongy" material/structure such as an aerogel. The thermochromic filter may include multiple input pathways (to serve as, for example, a mixer or signal combiner) or multiple output pathways (to serve as, for example, a signal splitter or diverter), or both.

Additionally, when formed into bulk materials, multiple layers of thermochromic filter may be stacked into three-dimensional structures and formed into programmable smart materials with numerous potential applications, possibly not envisioned at the time of the manufacture of a thermochromic filter device.

Although various embodiments of this invention have been described above with a certain degree of particularity, or with reference to one or more individual embodiments, those skilled in the art could make numerous alterations to the disclosed embodiments without departing from the spirit or scope of this invention. It is intended that all matter contained in the above description and shown in the accompanying drawings shall be interpreted as illustrative only of particular embodiments and not limiting. All directional references (e.g., proximal, distal, upper, lower, upward, downward, left, right, lateral, front, back, top, bottom, above, below, vertical, horizontal, clockwise, and counterclockwise) are only used for identification purposes to aid the reader's understanding of the present invention, and do not create limitations, particularly as to the position, orientation, or use of the invention. Connection references (e.g., attached, coupled, connected, and joined) are to be construed broadly and may include intermediate members between a collection of elements and relative movement between elements unless otherwise indicated. As such, connection references do not necessarily imply that two elements are directly connected and in fixed relation to each other. It is intended that all matter contained in the above description or shown in the accompanying drawings shall be interpreted as illustrative only and not limiting. Changes in detail or structure may be made without departing from the basic elements of the invention as defined in the following claims.

What is claimed is:

1. A thermochromic optical filter comprising
    a quantum well layer of a material having a chosen bandgap and of a chosen thickness; and
    a first barrier layer adjacent the quantum well layer, wherein
    a transition wavelength between opacity and transparency at a reference temperature is determined by the chosen bandgap of the material and the chosen thickness of the quantum well layer, and
    the transition wavelength is variable and controllable by changing the operating temperature of the thermochromic optical filter.

2. The thermochromic optical filter of claim 1, wherein the filter is configured as a long-pass filter.

3. The thermochromic optical filter of claim 1, wherein the filter is operable within an optical bandwidth.

4. The thermochromic optical filter of claim 1 further comprising a transparent substrate supporting the first barrier layer and the quantum well layer.

5. The thermochromic optical filter of claim 1 further comprising a second barrier layer positioned on an opposite side of the quantum well layer from the first barrier layer.

6. The thermochromic optical filter of claim 1 further comprising a temperature control system that selectively changes the bandgap of the quantum well layer in real time through control of the temperature of the material to maintain or adjust the transition wavelength.

7. The thermochromic optical filter of claim 6, wherein the temperature control system further comprises
    a cooling device;
    a heating device; and
    a temperature sensor.

8. The thermochromic optical filter of claim 7 further comprising a temperature-regulating device which determines a temperature of the thermochromic optical filter and adjusts an output of the heating device or an output of the cooling device, or both.

9. The thermochromic optical filter of claim 6, wherein the temperature control system is directly attached to the filter.

10. The thermochromic optical filter of claim 6, wherein the temperature control system is external to the filter.

11. The thermochromic optical filter of claim 1, wherein the quantum well layer comprises a plurality of quantum well layers of identical thickness or of varying thickness.

12. The thermochromic optical filter of claim 1, wherein the quantum well layer comprises a plurality of quantum well layers of identical composition or of varying composition.

13. The thermochromic optical filter of claim 1, wherein the quantum well layer is formed as a plurality of quantum wires.

14. The thermochromic optical filter of claim 1, wherein the quantum well layer is formed as a plurality of quantum dots.

15. The thermochromic optical filter of claim 1, wherein the filter is configured to selectively block wavelengths of light for receipt by an imaging sensor or photodetector.

16. A method of tunably and selectively filtering light comprising
  transmitting incident light through a quantum well of a chosen material thickness and a chosen bandgap that defines a transition wavelength between opacity and transparency at a particular desired value for a particular reference temperature, and
  adjusting an operating temperature of the quantum well to alter the chosen bandgap and thus alter the transition wavelength.

17. The method of claim 16, wherein the passing operation further comprises passing the incident light through a plurality of quantum well layers of identical thickness or varying thickness.

18. The method of claim 16, wherein the passing operation further comprises passing the incident light through a plurality of quantum well layers of identical composition or varying composition.

19. The method of claim 16, wherein the quantum well layer is formed as a plurality of quantum wires.

20. The method of claim 16, wherein the quantum well layer is formed as a plurality of quantum dots.

* * * * *